United States Patent [19]
Voelkel

[11] Patent Number: 6,108,227
[45] Date of Patent: Aug. 22, 2000

[54] CONTENT ADDRESSABLE MEMORY HAVING BINARY AND TERNARY MODES OF OPERATION

[75] Inventor: Eric Voelkel, Ben Lomond, Calif.

[73] Assignee: Lara Technology, Inc., San Jose, Calif.

[21] Appl. No.: 09/359,848

[22] Filed: Jul. 23, 1999

[51] Int. Cl.[7] ................................................ G11C 15/00
[52] U.S. Cl. ..................................... 365/49; 365/189.07
[58] Field of Search ............................. 365/49, 189.07, 365/230.03

[56] References Cited

U.S. PATENT DOCUMENTS

| | | | |
|---|---|---|---|
| 4,845,668 | 7/1989 | Sano et al. | 365/49 |
| 4,996,666 | 2/1991 | Duluk, Jr. | 365/49 |
| 5,010,516 | 4/1991 | Oates | 365/49 |
| 5,014,195 | 5/1991 | Farrell et al. | 364/200 |
| 5,072,422 | 12/1991 | Rachels | 365/49 |
| 5,440,715 | 8/1995 | Wyland | 395/435 |
| 5,517,441 | 5/1996 | Dietz et al. | 365/49 |
| 5,592,407 | 1/1997 | Konishi et al. | 365/49 |
| 5,949,696 | 9/1999 | Threewitt | 365/49 |
| 6,044,005 | 3/2000 | Gibson et al. | 365/49 |

*Primary Examiner*—Son Mai
*Attorney, Agent, or Firm*—Bradley T. Sako

[57] ABSTRACT

A content addressable memory (CAM) includes a number of novel CAM cells that can be switchable between a binary mode of operation and a ternary mode of operation. According to one embodiment, a novel CAM cell (100) can include a switchable impedance path (104) arranged in series with a compare circuit (110). A switchable impedance path (104) can include a first impedance path (106) arranged in series with a second impedance path (108). The first impedance path (106) can be controlled by a mode value (MODE) and the second impedance path (108) can be controlled by a mask value (/M).

20 Claims, 4 Drawing Sheets

CONTENT ADDRESSABLE MEMORY HAVING BINARY AND TERNARY MODES OF OPERATION

TECHNICAL FIELD

The present invention relates generally to content addressable memories (CAMs) and more particularly to CAM devices that can be selectable between a binary mode of operation and a ternary mode of operation.

BACKGROUND OF THE INVENTION

Information network systems continue to proliferate. Typically network data is transferred in data structures referred to as "packets." A packet can travel through network according to information included in a portion of the packet referred to as a "header." Network switches and/or routers can receive packets, extract information from the packet header, and process the packet according to the extracted information. Network header information can establish, to name just a few possible examples, the destination of a packet and/or the manner in which a packet should be transmitted.

Packet routing and/or switching typically utilizes a matching function. In a matching function, a header field will be compared to a number of entries. In the event the field (or a portion of the field) matches an entry, a match indication will be generated. The match indication can be used to generate particular processing information for the packet.

Routing and switching functions can be performed by general-purpose processors that run a routing algorithm. Such an approach can result in limited throughput of data packets, be expensive in terms of component cost, and require considerable area to implement when implemented as one or more integrated circuits.

One way to address the need for faster routers/network switches is to fabricate an integrated circuit that is specialized to perform routing/switching tasks. Such application specific integrated circuits (ASICs) are designed to perform particular routing functions such as a matching function in conjunction with a random access memory (RAM). Unfortunately, because ASICs are custom manufactured products, they can also be expensive to manufacture.

One type of device that is particularly suitable for matching functions is a content addressable memory (CAM) (also referred to as an "associative memory"). A CAM can include a number of data storage locations, each of which can be accessed by a corresponding address. The order in which the data values are stored varies according to the type of CAM. As just one example, in a typical "binary" CAM, data can be stored in the first available "empty" location. Empty locations can be distinguished from "full" (or valid) locations by a status bit associated with each storage location.

Valid locations in a binary CAM can be addressed according to the contents (data values) that they store. In a typical binary CAM matching function, a comparand value (which can be a header field or a portion thereof) can be loaded into a comparand register. The comparand value can then be compared to the data values within each valid location of the conventional binary CAM. In the event the value within the comparand register matches a value of a storage location, a match signal for the matching storage location will be generated. In the event there is more than one match, one match from the multiple matches may be selected according to predetermined priority criteria. The match indication can then be used to access other information (such as routing or packet processing information, as just two examples).

In some configurations, a match indication can be provided to an encoder that can generate an address value. An address value can be used to access associated data. In other configurations, a match line can be coupled to conventional random access memory (RAM) and/or read-only-memory (ROM) cells. Such arrangements can require two different types of memory cell arrays, or even two different integrated circuit devices. This can be costly and bulky to implement.

In yet other configurations, a binary CAM can include binary CAM cells, a portion of which function as binary CAM cells and another portion of which have their respective compare functions disabled, and thus function solely as RAM cells. The RAM cells can provide associated data for the binary CAM cells. While such an approach can provide CAM cells and associated data, ternary match operations (discussed below) are not possible. Further, compare circuitry is essentially wasted in those cells that function solely as RAM cells.

By providing for the simultaneous comparison of a comparand word value (a row of comparand bit values) with a number of data words, a rapid match function can be accomplished with a binary CAM.

One drawback to conventional binary CAMs is that matching functions are typically performed on data values having a fixed number of bits. Unfortunately, many routing and switching functions can require matching a comparand value to data values having variable bit lengths. One such variable length compare operation is a longest prefix matching operation.

An example of longest prefix matching operation will be described below. Two data values (data0 and data1) are set forth. The data values (data0 and data1) are binary values having portions that can be compared to a comparand value (shown as either a 0 or 1). In addition, the data values (data0 and data1) have portions that do not have to be matched. These "non-match" portions are represented by a series of Xs. It is understood that each X could be a 0 or 1 but is represented by an X because the digit should not be compared with a comparand value.

| | | | | |
|---|---|---|---|---|
| 11110000 | 10XXXXXX | XXXXXXXX | XXXXXXXX | (data 0) |
| 11110000 | 10010101 | 100XXXXX | XXXXXXXX | (data 1) |

For the example of the data values set forth above, if the following comparand value is applied:

| | | | | |
|---|---|---|---|---|
| 11110000 | 10010101 | 10010000 | 11010001 | (comparand). |

Both data values can result in a match indication. It is preferred that the data 1 value match indication have priority as it provides the longest prefix match.

One type of device that can be particularly suitable for longest prefix matching is a "ternary" or "tertiary" CAM. In a conventional ternary CAM, a mask bit is provided for each data bit. When the mask bit has a first predetermined value (a logic low, for example) its compare operation will be masked. Ternary CAM entry values are set forth below for the two examples previously described.

| | | | | |
|---|---|---|---|---|
| 11110000 | 10XXXXXX | XXXXXXXX | XXXXXXXX | (data 0) |
| 11111111 | 11000000 | 00000000 | 00000000 | (mask 0) |
| 11110000 | 10010101 | 100XXXXX | XXXXXXXX | (data 1) |
| 11111111 | 11111111 | 11100000 | 00000000 | (mask 1) |

Figure 6:
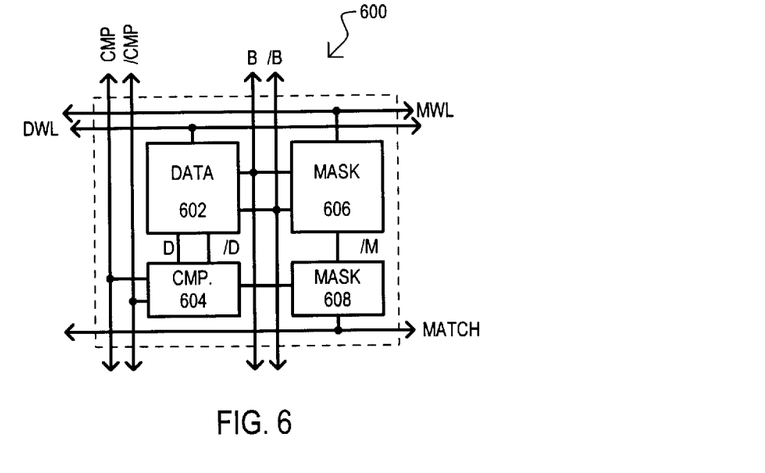
FIG. 6 is a block diagram of a conventional ternary CAM cell.

To better understand the present invention, and to more clearly distinguish the described embodiments from conventional CAM approaches, a conventional ternary CAM cell is set forth in FIG. 6. The conventional ternary CAM cell is designated by the general reference character 600, and is shown to include data store 602, a compare circuit 604, a mask store 606, and a mask circuit 608. Data values can be entered into the data register 602 by placing data values on a bit line pair (B and /B) and activating a data word line DWL. Similarly, mask values can be entered into the mask store 606 by placing data values on a bit line pair (B and /B) and activating a mask word line MWL. It is understood that the word lines (DWL and MWL) can be commonly coupled to a row of CAM cells and the bit line pair (B and/B) can be commonly coupled to a column of CAM cells.

The compare circuit 604 can receive the data value stored within the data store 602 by way of complementary data lines D and /D and a complementary comparand values by way of compare lines CMP and /CMP. The compare circuit 604 compares the data value and comparand value, and in the event the values are different, activates a match indication on match line M. In the particular conventional example of FIG. 6, the compare circuit 604 is an exclusive OR (XOR) or exclusive NOR (XNOR) circuit.

Unlike a conventional binary CAM cell, which would couple comparison results of a compare circuit directly to a match line, in the conventional ternary CAM cell 600, comparison results can be masked by the mask circuit 608. In the event the mask register 606 includes an active mask data bit (/M), the mask circuit 608 can prevent a comparison result from affecting the match line "MATCH."

Figure 7:
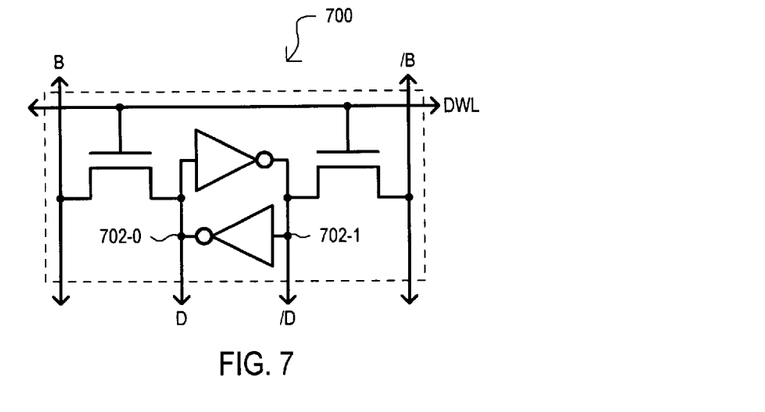
FIG. 7 is a schematic diagram of a conventional store circuit.

FIG. 7 illustrates an example of a conventional store that may be used in a CAM (as item 602 or 606 in FIG. 6, as just one example). The store is designated by the general reference character 700. Complementary stored data values stored within store 700 are provided at data nodes 702-0 and 702-1. Data values can be set within the store 700 by driving a bit line pair (B and /B) to complementary data values and activating a corresponding word line WL.

Figure 8:
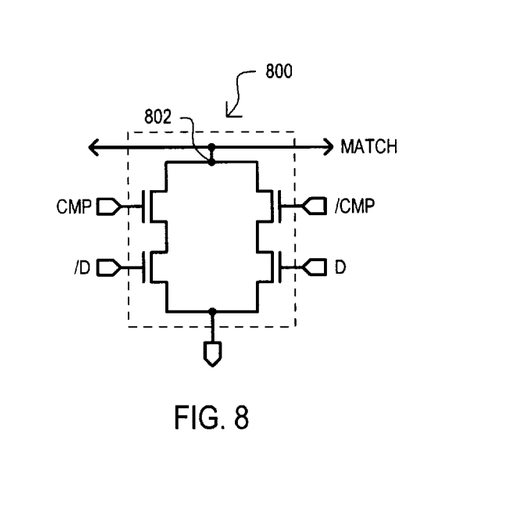
FIG. 8 is a schematic diagram of a conventional compare circuit.

FIG. 8 sets forth a conventional compare circuit 800 that may be used in a CAM (as item 604 in FIG. 6, as just one example). The compare circuit 800 can receive complementary data values (D and /D) and complementary comparand values (CMP and /CMP). An indication node 802 can be precharged to a high logic level at the beginning of a compare operation. A data value (D and /D) and comparand value (CMP and /CMP) can then be applied to the compare circuit 800. In the event the data value (D and /D) is different form the comparand value (C and /C), the indication node 802 will be discharged (or charged) to particular voltage. In the event the data value (D and /D) matches the comparand value (CMP and /CMP), the indication node 802 can remain charged (or discharged), indicating a match condition. The indication node 802 can be common to a number of CAM cells of the same row. Thus, an indication node 802 that remains precharged (or discharged) after a match operation can indicate a match between a row of comparand values and a row of data values (i.e., function as a match line).

Figure 9:
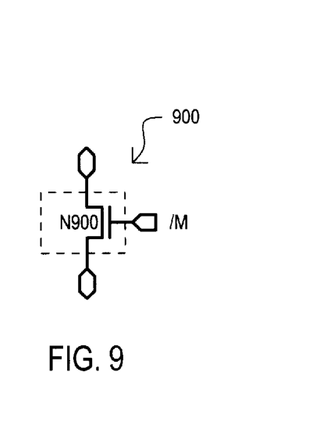
FIG. 9 is a schematic diagram of a conventional mask circuit.

FIG. 9 is a schematic diagram illustrating the mask circuit of the ternary CAM 600 of FIG. 6. The mask circuit 900 is shown to be an n-channel metal-oxide-semiconductor (MOS) transistor N900 that can have a source-drain path in series with a compare circuit, such as that set forth in FIG. 8. The gate of transistor N900 can be driven by a mask signal /M.

As noted above, some CAM applications can be met with binary CAMs while other applications can be met with ternary CAMs. Further, ternary CAMs can essentially operate in a binary mode by setting all mask values to "1." However, to place a conventional ternary CAM into a binary mode can require a number of mask value write operations. This can require valuable time to accomplish.

There may also be some CAM applications that can require both fixed and variable comparand value matching. Such applications can be met my employing a binary and ternary CAM, or alternatively, a ternary CAM having set portions with mask values that are programmed to "1." The first solution can be costly to implement and consume more space on a circuit board. The latter solution can include write operations that can consume valuable time.

It would be desirable to arrive at some sort of CAM device that can provide for rapid switching between a binary mode of operation and a ternary mode of operation.

Because a typical CAM can include a number of CAM cells arranged into an array, it can be desirable to keep CAM cells as small as possible. Increases in cell size can translate into substantial increases in overall CAM array size. Accordingly, while it can be desirable to provide a CAM having a binary and ternary mode of operation, it can be further desirable to provide such a CAM with a cell size that is not substantially larger than the size of conventional ternary CAM cells.

SUMMARY OF THE INVENTION

According to one embodiment of the present invention, a novel content addressable memory (CAM) can include novel CAM cells that can operate in a ternary mode of operation or a binary mode of operation.

According to one aspect of the embodiments, the novel CAM cells can provide a binary mode of operation that is not dependent upon stored masked data.

According to another aspect of the embodiments, the novel CAM can switch from a binary mode of operation to a ternary mode of operation without affecting stored mask data.

According to another aspect of the embodiments, the novel CAM can include an array of CAM cells having rows and columns, the CAM cells can be selectable between a binary mode and ternary mode of operation on a column-by-column basis.

According to another aspect of an embodiment, each novel CAM cell can be coupled to a match line. The novel CAM cells can include a mask circuit having a discharge (or charge) path to the match line. The charge path can be controlled by a data/comparand match result, a mask bit, and a mode signal.

According to another aspect of an embodiment, each novel CAM cell can be coupled to a match line and include a discharge (or charge) path. The discharge (or charge) path can include a mask path, that is controlled by a mask bit, and a mode path, that is arranged in parallel with the mask path. The mode path is controlled by the mode signal.

According to another aspect of an embodiment, CAM device can include novel ternary CAM cells that can switch between a ternary mode of operation and a binary mode of operation. CAM cells in a ternary mode of operation can have mask values that can selectively mask a comparison between a comparand value and a data value. CAM cells in a binary mode can provide a binary comparison between a comparand value and a data value, and a mask value that can function as an associated data value.

DETAILED DESCRIPTION OF THE EMBODIMENTS

Various embodiments of the present invention will now be described with reference to a number of diagrams. The embodiments can include novel content addressable memory (CAM) cells that can be rapidly switched between a ternary mode of operation and a binary mode of operation.

Figure 1:
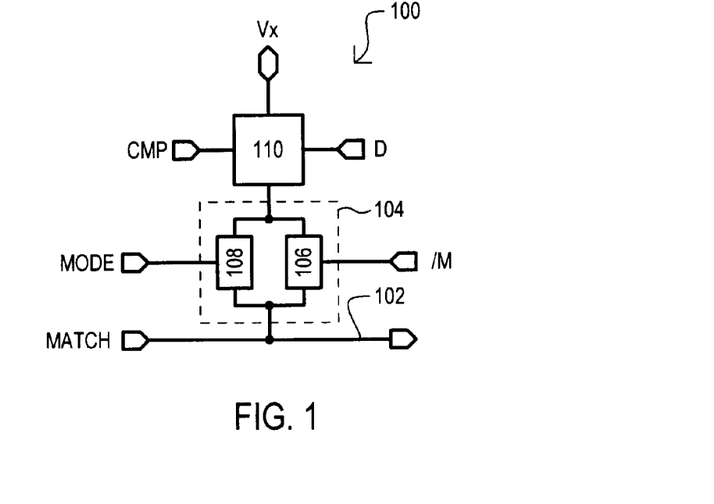
FIG. 1 is a block diagram of a first embodiment.

Referring now to FIG. 1, a first embodiment is set forth in a block diagram and designated by the general reference character 100. The first embodiment 100 is shown to include a match line 102. A match line 102 can provide a match indication (MATCH). A match indication can be initially set to a first potential, and then discharged (or charged) to a second potential (Vx). A first embodiment 100 can also include a switchable impedance path 104. A switchable impedance path 104 can receive a number of control values, including a mask value /M and a mode value MODE. When the MODE value has a first state, an impedance path between the match line 102 and the second potential Vx can be determined according to the mask value /M. However, when the MODE value has a second state, an impedance path between the match line 102 and the second potential Vx can be low impedance path, regardless of the mask value /M.

In the particular arrangement of FIG. 1, the switchable impedance path 104 can include a first impedance path 106 and a second impedance path 108. The first impedance path 106 can be controlled by the mask value /M. Thus, when the mask value /M is active, the first impedance path 106 can have a high impedance that can prevent the match line 102 from discharging (or charging) toward the Vx potential at a predetermined rate. When the mask value /M is inactive, the first impedance path 106 can have a low impedance that can provide a discharge (or charge) path between the match line 102 and the potential Vx.

The second impedance path 108 can be arranged in parallel with the first impedance path 106. The second impedance path 108 can be controlled by the mode value MODE. Thus, when the mode value MODE is active, the second impedance path 108 can have a high impedance that can prevent the match line 102 from discharging (or charging) toward the Vx potential at a predetermined rate. When the mode value MODE is inactive, the second imped-ance path 108 can have a low impedance that can provide a discharge (or charge) path between the match line 102 and the potential Vx. In this way, when the second impedance path 108 has a low impedance path, a discharge path can be provided regardless of the particular mask value /M.

It is understood that while the particular arrangement of FIG. 1 has the first and second impedance paths (106 and 108) coupled in parallel between the same nodes, other intermediate circuits could be included the impedance paths (106 and 108).

It is also understood that other circuit structures could be arranged in series with the switchable impedance path 104. FIG. 1 illustrates a compare circuit 110 between the Vx potential and the switchable impedance path 104. A compare circuit 110 can compare a data value D with a comparand value CMP. Of course, a compare circuit, or other circuits, could be situated between the match line 102 and the switchable impedance path 104.

The switchable impedance path 104 can also be conceptualized as including a "mode" path 108 that provides a mode setting function, and a "mask" path 106 that provides a ternary matching function.

Figure 2:
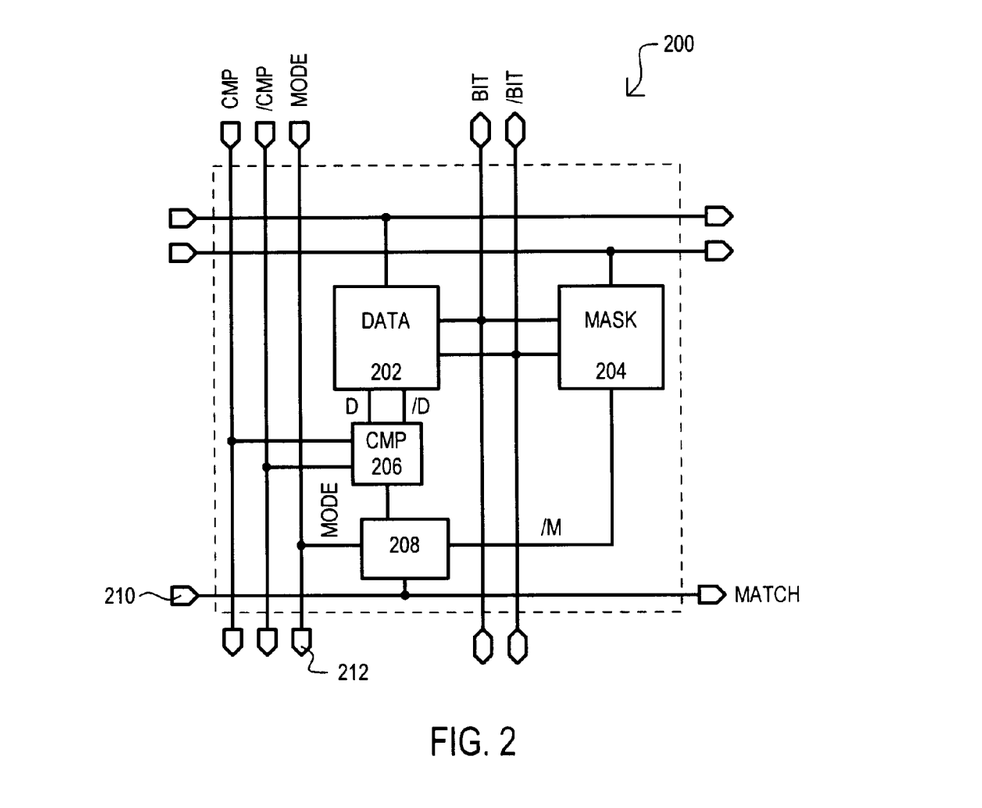
FIG. 2 is a block diagram of a second embodiment.

Referring now to FIG. 2, one example of a CAM cell according to a second embodiment is illustrated. The second embodiment is designated by the general reference character 200, and is shown to include a data store 202 and a mask store 204. A data store 202 can store a data value D that can be compared to a comparand value CMP. In the particular arrangement of FIG. 1, data values can be read from the data store 202 by activating a data word line DWL and amplifying data values on complementary bit lines BIT and /BIT. Similarly, data values can be read from the data store 202 by driving the complementary bit lines (BIT and /BIT) and then activating the data word line DWL.

A mask store 204 can store a mask value M that can mask a compare operation between the stored data value (D) and an applied comparand value CMP. Mask values can be read from or written to in the mask store 204 in the same general fashion as a data value can be stored in the data store 202, except a mask word line MWL is activated instead of the data word line DWL.

It is understood that the mask data for a cell does not necessarily have to be stored within the cell. Such mask data can be stored in a separate location, or be provided by a separate memory device.

The data store 202 has a data store output that can provide complementary data values (D and /D) to a compare circuit 206. The compare circuit 206 can also receive a complementary comparand value (CMP and /CMP) input on complementary comparand lines. The compare circuit 206 can compare the data value (D and /D) and the comparand value (CMP and /CMP) and generate a match result. A match result can take a variety of forms. As just one example, a match result can result in a low impedance path to a predetermined voltage.

A switchable impedance path 208 can receive a mask value /M from a mask value output of the mask store 204 and a mode value MODE. The switchable impedance path 208 can operate in the same fashion as described above in conjunction with FIG. 1. In this way the match result can be coupled to the match line 210 according to either the mode value MODE or the mask value /M. Looked at in another way, one portion of a charge/discharge path can be formed according to a match result in the compare circuit 206. Another portion of the charge/discharge path can be formed by the switchable impedance path 208.

The switchable impedance path 208 can also be conceptualized as a mask-mode circuit, as it can provide a ternary mode masking operation or a ternary-binary mode setting operation.

It is noted that a CAM can include a number of novel CAM cells, such as that set forth in FIG. 2. In such an arrangement, mode lines (such as 212) can be used to place multiple numbers of CAM cells into a ternary or binary mode of operation. As just one example, mode lines (such as 212) can extend in a column direction. In such an arrangement, one or more columns of CAM cells can be switched between modes. Such a switching capability can be performed for an entire array, or for portions of an array on a column-by-column basis. Of course, mode values can be applied to cells on a cell-by-cell basis or by other arrangements, such as a row-by-row basis.

Thus, according to the present invention, a CAM cell array can be subdividable into portions that operate in a binary or ternary fashion.

Further, a CAM device can include a number of different array blocks, with selected array block being placed in a ternary mode of operation or a binary mode of operation according to mode signals.

Having described the general constituents of a CAM cell according to one embodiment 200, one example of a compare operation will be described. The data store 202 can store a data value (D) and the mask store 204 can store a mask value (/M). The match line 210 can be precharged to a precharge potential. The comparand lines (CMP and /CMP) can be discharged to a discharge potential. With the comparand lines both at a low potential, the compare circuit 206 can provide a high impedance path to a discharge potential. The mode value MODE can be set to a particular value depending upon mode of operation. As just one example, a ternary mode of operation can be enabled when the mode value MODE is low, and a binary mode of operation can be enabled when the mode value MODE is high.

A comparand value can then be applied, driving comparand lines (CMP and /CMP) to complementary values. Within the compare circuit 206, the comparand value (CMP and /CMP) is compared to the data value (D and /D). In one particular arrangement, if a match condition exists (i.e., CMP and /CMP are equal to D and /D, respectively), the compare circuit 206 can continue to provide a high impedance path to the discharge potential. If a mismatch condition exists (i.e., CMP and /CMP are not equal to D and /D, respectively), the compare circuit 206 can provide a low impedance path to the discharge potential.

If the MODE value is high, the CAM cell 200 will operate in a binary mode of operation, as the switchable impedance path 208 can provide a low impedance path from the match line 210 to the compare circuit 206, regardless of what particular mask value /M is held by the mask store 204.

If the MODE value is low, the CAM cell 200 will operate in a ternary mode of operation, as the impedance provided by the switchable impedance path 208 can be dependent on the mask value /M (assuming the mode value MODE is low). If the mask value /M is low, the switchable impedance path 208 can provide a high impedance path from the match line 210 to the compare circuit 206, thereby masking the compare operation of the compare circuit 206. If the mask value /M is high, the switchable impedance path 208 can provide a low impedance path from the match line 210, allowing the results of the compare operation within the compare circuit 206 to result in a discharge of the match line 210.

One skilled in the art would recognize that a CAM cell could be constructed according to the teachings set forth herein that includes a match line that is predischarged. A match line can then be charged to provide a match indication. Further, complementary comparand lines (CMP and /CMP) could be precharged instead of discharged. Such complementary lines can also be equalized.

Figure 3:
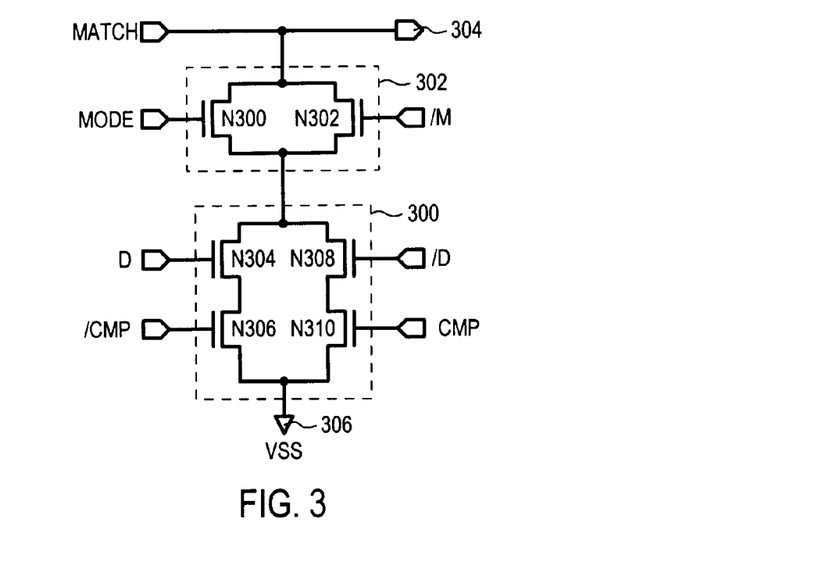
FIG. 3 is a schematic diagram of a third embodiment.

Referring now to FIG. 3, a schematic diagram is set forth illustrating a compare circuit and switchable impedance path according to a third embodiment. The compare circuit is shown as item 300 and the switchable impedance path is shown as item 302. A switchable impedance path 302 and compare circuit 300 can provide a low impedance path between a match line 304 and a predetermined voltage node 306. In the particular arrangement of FIG. 3, a discharge path can be formed between the match line 304 and a low power supply voltage VSS according to a MODE value, a mask bit value /M, a data value (D and /D), and a comparand value (C and /C).

The switchable impedance path 302 can include two insulated gate field effect transistors (IGFETs) having source-drain paths arranged in parallel between the match line 304 and the compare circuit 300. In the arrangement of FIG. 3, the switchable impedance path 302 can include two n-channel IGFETs (N300 and N302) having drains commonly connected to match line 304 and sources commonly connected to the compare circuit 300. The gate of transistor N300 can receive the mode value MODE. The gate of transistor N302 can receive the mask bit value /M. In this arrangement, when the MODE signal is high, transistor N300 is turned on and the switchable impedance path 302 can include a low impedance path between the match line 304 and the voltage node 306, regardless of the value of a mask bit /M. However, when the MODE signal is low, transistor N300 is turned off. Thus, the switchable impedance path 302 can provide a low impedance when the inverse mask bit /M is high, and a high impedance path when the inverse mask value /M is low.

The compare circuit 300 can also include controllable impedance paths, at least one of which is enabled when a data bit value (D) and comparand bit value (CMP) are different. The paths can be formed by the series arrangement of IGFETs. In the particular arrangement of FIG. 3, a first path is formed by two n-channel IGFETs N304 and N306, having source-drain paths arranged in series between the switchable impedance path 302 and the voltage node 306. The gate of transistor N304 can receive a data value D. The gate of transistor N306 can receive a complementary comparand value /CMP. A second path can be formed by two other n-channel MOSFETs, N308 and N310, also having source-drain paths arranged in series between the switchable impedance path 302 and the voltage node 306. The gate of transistor N308 can receive complementary data bit value /D and the gate of transistor N310 can receive a comparand bit value CMP.

Figure 4:
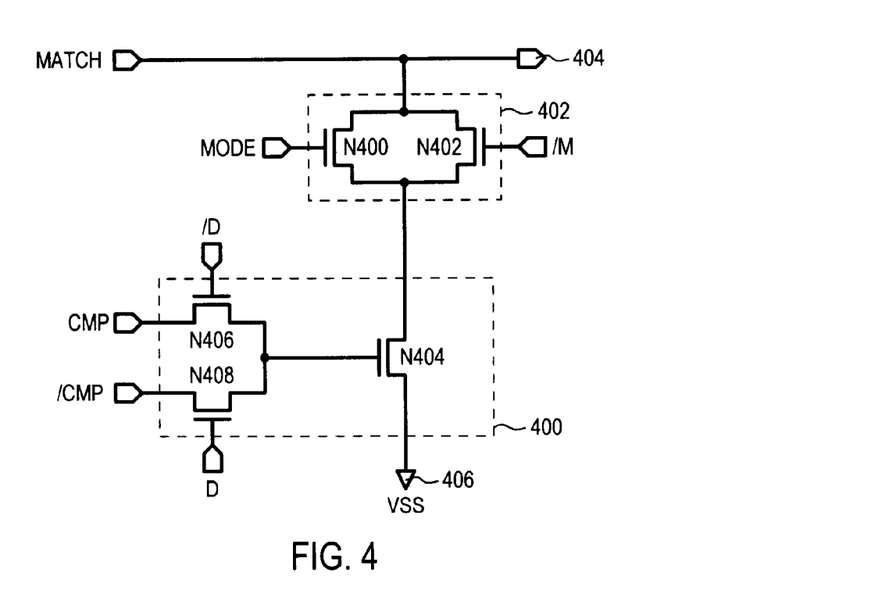
FIG. 4 is a schematic diagram of a fourth embodiment.

Referring now to FIG. 4, a schematic diagram is set forth illustrating a compare circuit 400 and switchable impedance path 402 according to a different embodiment. A switchable impedance path 402 and compare circuit 400 can provide a low impedance path between a match line 404 and a predetermined voltage node 406. In the particular arrangement of FIG. 4, like that of FIG. 3, a low impedance path can be formed between the match line 404 and a voltage node 406.

The switchable impedance path 402 can have the same general arrangement as that of FIG. 4, and is shown to include transistors N400 and N402.

The compare circuit 400 of FIG. 4 can include one impedance path that is enabled when a data bit value and a comparand bit value are different. The path can be formed by an IGFET. In the particular arrangement of FIG. 4, the path is formed by an n-channel MOSFET N404 having a source-drain path arranged in series between the switchable impedance path 402 and a voltage node 406. The gate of transistor N404 is controlled by two other n-channel MOSFETs N406 and N408. Transistors N406 and N408 have drains that are commonly connected to the gate of transistor N404. The source of transistor N406 is connected to a comparand value CMP and the source of transistor N408 is connected to an inverse comparand value /CMP. The gate of transistor N406 can receive an inverse data bit value /D. The gate of transistor N408 can receive a data bit value D.

In the arrangement of FIG. 4, when a comparand value differs from a data bit value, transistor N404 will be turned on, creating a low impedance path between the switchable impedance path 402 and voltage node 406.

It is understood that the particular order of a switchable impedance path and compare circuit between a match line and a discharge (or charge) voltage should not be construed as limiting the invention thereto. Further, the particular type of active devices (e.g., n-channel MOSFETs) should also not be construed as limiting. Still further, such switchable impedance paths can include various other intermediate circuits in the charge/discharge path.

The particular arrangements of FIGS. 3 and 4 can illustrate how a CAM cell having switchable modes can be formed without the addition of a large number of additional circuitry. In particular, in the circuits of FIGS. 3 and 4, the addition of transistors N300 and N400, respectively, can transform a ternary CAM cell arrangement into a novel CAM cell that is switchable between ternary and binary modes.

Figure 5:
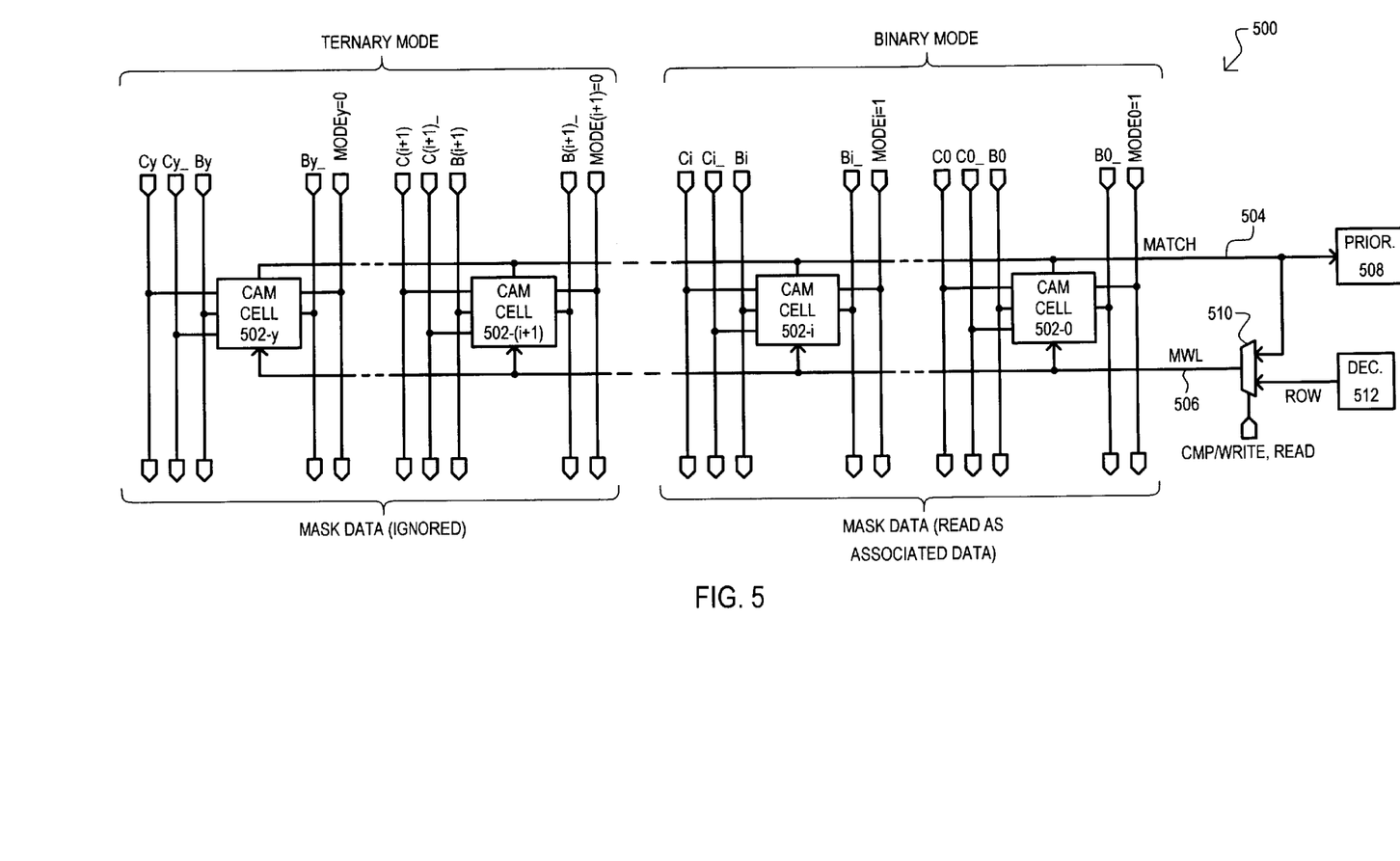
FIG. 5 is a block diagram of a fifth embodiment.

Referring now to FIG. 5, a block diagram is set forth illustrating a fifth embodiment of the present invention. The fifth embodiment is designated by the general reference character 500, and can include a number of novel CAM cells, shown as 502-y to 502-0. The CAM cells (502-y to 502-0) can be switchable between a binary mode of operation and a ternary mode of operation. The CAM cells (502-y to 502-0) can also have a structure such as those described above.

In the particular arrangement of FIG. 5, the CAM cells (502-0 to 502-y) can store a data value that can be compared to a comparand value and a mask value. In the arrangement illustrated by FIG. 5, particular CAM cells (502-y to 502-(i+1)) can operate in a ternary mode of operation, and thus include mask values that can selectively mask (or not mask) a compare operation between a comparand value and a data value. Certain other CAM cells (502-i to 502-0) can operate in a binary mode of operation and have mask values that can function as associated data. In this way, a compare operation between ternary mode (502-y to 502-(i+1)) and binary mode (502-i to 502-0) CAM cells can be used to access associated data stored in the binary mode CAM cells (502-i to 502-0).

In the arrangement of FIG. 5, the CAM cells (502-y to 502-0) can be commonly coupled to a match line 504 and a word line 506. The match line 504 can be precharged (or predischarged) to a particular level, and then discharged (or charged) to provide a match indication.

The word line 506 can provide access to the CAM cells (502-y to 502-0) and allow mask data to be written into those CAM cells that will operate in a ternary mode of operation, and associated data to be written into those CAM cells that will operate in a binary mode of operation. The word line 506 can also allow associated data to be read from those CAM cells operating in a binary mode of operation. In one particular arrangement, such an operation may also read mask data from ternary CAM cells, but this data can be ignored.

The match line 504 can be coupled to a priority encoder 508. The priority encoder 508 can provide priority from a number of active match indications. In addition, the priority encoder 508 can encode an active match indication into an output value.

The fifth embodiment 500 can further include a mode multiplexer (MUX) 510. The mode multiplexer can activate the mask word line 506 according to particular operations. In a compare operation, the match line 504 value can be coupled to the mask word line 506. Thus, if a match indication exists, associated data can be read from those CAM cells that are operating in a binary mode of operation.

In a mask read or write operation, a decoder value ROW, generated by a decoder circuit 512, can be coupled to the mask word line 506. In this way, mask data can be read from or written into the CAM cells (502-y to 502-0). As noted above, the mask data can include data that can serve as associated data.

It is understood that in the arrangement of FIG. 5, multiple rows of novel ternary CAM cells can be commonly coupled to the mode lines (MODEy to MODE0) on a column-wise basis. Such an arrangement can allow for arbitrary column-wise selection of which cells will operate in a ternary mode, and which cells will operate in a binary mode and store associated data. Of course, multiple columns can be coupled to the same mode signal.

In this way, a CAM device can provide CAM cells that provide both a matching operation, as well as store associated data. Compare circuits are not "wasted" providing for efficient use of all circuitry in the novel CAM.

The use of n-channel IGFETs in the particular arrangements of FIGS. 3 and 4 can also illustrate a compact and rapidly operating circuit. It is understood however, that such a particular arrangement should not be construed as limiting to the invention.

As also illustrated by the various embodiments, a binary mode of operation can be enabled by essentially "bypassing" or "overriding" the operation of a masking circuit. Thus, a binary mode is not dependent upon setting particular mask values. Further, mask values are not affected by a binary mode of operation.

It is also understood that in the arrangement of FIG. 2, the CAM cell 200 (or a column of CAM cells) can be placed in a binary mode of operation by activating a line carrying the MODE signal. This can be much faster and less complex than writing particular mask values into cells in order to achieve a binary mode of operation.

While the present invention can be implemented as an integrated circuit, other implementations could include multiple integrated circuits. Further, the present invention could form one portion of a larger integrated circuit (be "embedded").

Accordingly, it is also understood that while various embodiments have been described in detail, it should be understood that the present invention could be subject various changes, substitutions, and alterations without departing from the spirit and scope of the invention. Accordingly, the present invention is intended to be limited only as defined by the appended claims.

What is claimed is:

1. A content addressable memory (CAM) device, comprising:
   a plurality of CAM cells, each CAM cell including
      a data value store having a data value output,
      a mask value store having a mask value output,
      a compare circuit having inputs coupled to the data value output and the mask value output, the compare circuit comparing the data value and the mask value and generating a match indication, and
      a switchable impedance path coupled to the compare circuit, the switchable impedance path including a first controllable impedance controlled by a mode value, and a second controllable impedance path in parallel with the first controllable impedance path, the second controllable impedance path being controlled by the mask value output.

2. The CAM device of claim 1, wherein:
   the compare circuit and switchable impedance path are arranged in series between a match line and a predetermined voltage node.

3. The CAM device of claim 1, wherein:
   the first controllable impedance path is arranged in parallel with a second controllable impedance path.

4. The CAM device of claim 3, wherein:
   the first controllable impedance path includes a mode insulated gate field effect transistor (IGFET) having a source-drain path and a gate, the gate of the mode IGFET being coupled to the mode value input, and
   the second controllable impedance path includes a mask IGFET having a source-drain path arranged in parallel with the source-drain path of the mode IGFET, the gate of the mask IGFET being coupled to the mask value output.

5. The CAM device of claim 4, wherein:
   the mode IGFET and mask IGFETs are n-channel IGFETs.

6. The CAM device of claim 1, wherein:
   the compare circuit includes
      at least one controllable compare impedance path that is controlled by a data value output and a compare value input.

7. The CAM device of claim 6, wherein:
   the data value output also includes a complementary data value output;
   the compare value input also includes a complementary compare value input;
   the compare circuit includes
      a first controllable compare impedance path that is controlled by a data value output and a complementary compare value input, and
      a second controllable compare impedance path that is controlled by a complementary data value output and a compare value input.

8. The CAM device of claim 7, wherein:
   the first and second controllable compare impedance paths include IGFETs.

9. The CAM device of claim 8, wherein:
   the IGFETs are n-channel IGFETs.

10. A content addressable memory (CAM), comprising:
    a plurality of CAM cells arranged into rows and columns, the CAM cells of the same column being commonly coupled to an associated mode line that can carry a mode value, the data CAM cells of the same row being commonly coupled to an associated match line, each CAM cell including
       a data store that can store a data bit,
       a mask store that can store a mask bit,
       a data compare circuit that can compare the data bit with a comparand bit, and
       a mask-mode circuit arranged in series with the data compare circuit, the mask-mode circuit providing a mask impedance path that is enabled by the mask bit and a mode impedance path in parallel with the mask impedance path, the mode impedance being enabled by the associated mode line.

11. The CAM of claim 10, wherein:
    the compare circuit can include an exclusive-OR circuit.

12. The CAM of claim 10, wherein:
    the compare circuit can include an exclusive-NOR circuit.

13. The CAM of claim 10, wherein:
    the mask-mode circuit includes a switchable impedance path that can be enabled by a predetermined mask bit or a predetermined mode value.

14. The CAM of claim 13, wherein:
    the switchable impedance path can be disabled by a predetermined combination of the mask bit and mode value.

15. The CAM of claim 14, wherein:
    the switchable impedance path includes two controllable impedance paths, one controllable impedance path being controlled by the mask bit, the other controllable impedance path being controlled by the mode value.

16. A content addressable memory (CAM), comprising:
    at least one match line;
    at least one mask word line; and
    a plurality of novel CAM cells coupled to the match line, each novel CAM cell including
       a data store that can store a data value,
       a mask store that can store a mask value or an associated data value, the mask store being coupled to the mask word line,
       a compare circuit that can compare the data value and a comparand value and generate a compare indication, and
       a mask-mode circuit coupled between the compare circuit and the match line that receives a mode value and the mask value, the mask-mode circuit having a compare indication signal path that is enabled by a mode value of a first state, the enabled or disabled according to the mask value by the mode value of a second state.

17. The CAM of claim 16, wherein:
    each mask-mode circuit can include a first controllable impedance path that is controlled by the mode value and a second controllable impedance path, in parallel with the first controllable impedance path, that is controlled by the mask value.

18. The CAM of claim 16, including:
    the plurality of CAM cells are arranged into rows and columns;
    a plurality of match lines, each match line being commonly coupled to a row of CAM cells;
    a plurality of mask word lines, each mask word line being commonly coupled to a row of CAM cells;
    a plurality of bit lines, at least one bit line being commonly coupled to a column of CAM cells; and
    a plurality of mode lines, at least one mode line being commonly coupled to a column of CAM cells.

19. The CAM of claim 16, wherein:

the match line is coupled to the mask word line.
20. The CAM of claim 19, further including:
the match line is coupled to the mask word line by a mode multiplexer, the mode multiplexer having a first input coupled to match line, a second input coupled to a decoder, and an output coupled to the mask word line.

* * * * *